US006229219B1

United States Patent
Bhagath et al.

(10) Patent No.: US 6,229,219 B1
(45) Date of Patent: May 8, 2001

(54) FLIP CHIP PACKAGE COMPATIBLE WITH MULTIPLE DIE FOOTPRINTS AND METHOD OF ASSEMBLING THE SAME

(75) Inventors: Shrikar Bhagath, San Jose; Alexander C. Tain, Milpitas, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/538,400

(22) Filed: Mar. 29, 2000

(51) Int. Cl.[7] .................................................. H01L 29/40
(52) U.S. Cl. ............................. 257/778; 257/784
(58) Field of Search ..................... 257/778, 784, 257/786, 777, 686

(56) References Cited

U.S. PATENT DOCUMENTS

| 5,399,898 | * | 3/1995 | Rostoker | 257/499 |
| 5,719,440 | * | 2/1998 | Moden | 257/697 |
| 5,793,101 | * | 8/1998 | Kuhn | 257/676 |
| 5,815,372 | * | 9/1998 | Gallas | 361/760 |
| 5,930,597 |   | 7/1999 | Call et al. | 438/106 |
| 5,952,726 | * | 9/1999 | Liang | 257/778 |
| 6,002,178 | * | 12/1999 | Lin | 257/778 |

* cited by examiner

Primary Examiner—Nathan Flynn
Assistant Examiner—Remmon R. Fordé

(57) ABSTRACT

A flip chip package compatible with first and second die footprints includes an interconnection substrate having a connection surface configured to receive an integrated circuit die that has either a first or a second die footprint. The interconnection substrate has a plurality of conductive pads on its connection surface for establishing a connection to the conductive pads of the selected integrated circuit die. The connection surface conductive pads have a first section corresponding to the conductive pads of an integrated circuit with a first die footprint. It also has a second section corresponding to the conductive pads of an integrated circuit with a second die footprint. The first and second sections of conductive pads overlap, reducing the size of the package footprint while allowing the same package to be used with different integrated circuit dies.

1 Claim, 4 Drawing Sheets

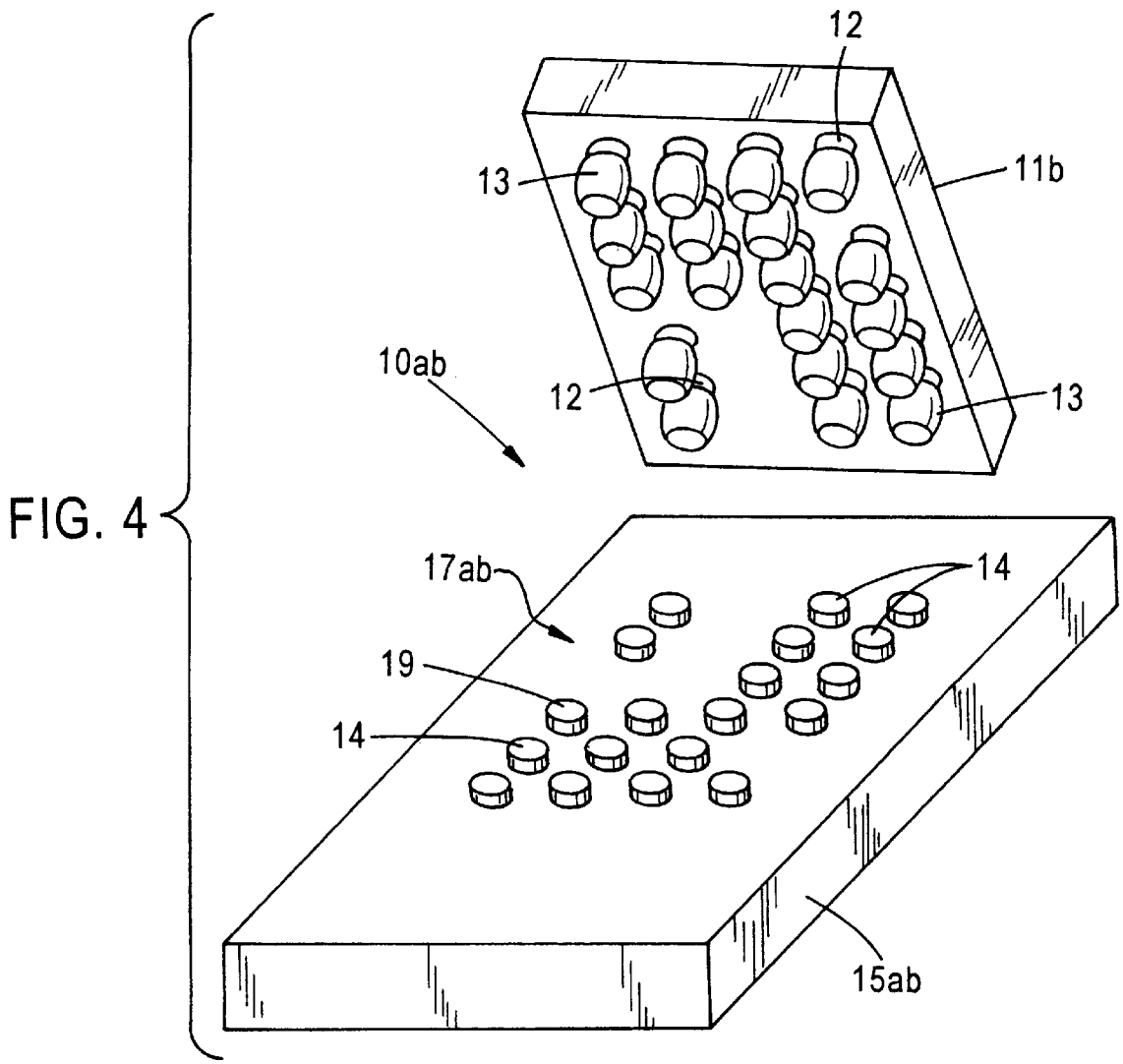

FLIP CHIP PACKAGE COMPATIBLE WITH MULTIPLE DIE FOOTPRINTS AND METHOD OF ASSEMBLING THE SAME

FIELD OF THE INVENTION

The present invention relates to the packaging of integrated die circuits, and in particular, to the flip chip packaging of integrated circuits and a method of performing the same.

DESCRIPTION OF RELATED ART

Electronic components utilizing integrated circuit chips are used in a number of applications. Controlled Collapse Chip Connection is an interconnect technology developed as an alternative to wire bonding. This technology is generally known as C4 technology, or flip chip packaging. Broadly stated, one or more integrated circuit chips are mounted above a single or multiple layer substrate and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

In general, flip chip joining is desirable for many applications because the footprint or area required to bond the chip to the substrate is approximately equal to the area of the chip itself. Flip chip joining also exploits the use of a relatively small solder bump which typically measures a height of approximately 1 mil to 1.5 mil and a width of approximately of 2 to 4 mils to join the pad on a chip to a corresponding pad on the substrate. Electrical and mechanical interconnects are formed simultaneously by reflowing the bumps at an elevated temperature. The C4 joining process is self-aligning and the wetting action of the solder will align the chip's bump pattern to the corresponding substrate pads. This action compensates for chip to substrate misalignment, up to several mils, incurred during chip placement.

Different integrated circuit dies have different die footprints. A die footprint is characterized by the pattern of conductive pads on the surface of the die. In conventional packages, a footprint is provided that exactly matches (a mirror reflection) the die footprint of a particular integrated circuit die. Hence, when a die is flipped onto the package, the conductive pads of the die correspond on a one-to-one basis with the conductive pads of the package. This is due to the package footprint being an exact mirror duplicate of the die footprint.

As stated earlier, however, different dies will have different footprints. In certain technologies, an enhanced version of an integrated circuit die may have a different die footprint. However, it is normally desirable to use the same package since the external connections of the package may be the same for standardizing the connections of an assembled integrated circuit die package to a circuit board. In order to properly connect to a second die, a conventional package needs a different package footprint than the package footprint used with a first die. In other words, the same package cannot normally be used to connect to different integrated circuit dies having different die footprints. This increases the overall cost of manufacture since multiple types of packages are needed for multiple types of integrated circuit dies. Also, the same package cannot be re-used to receive a different integrated circuit die, having a different die footprint. Such a feature is desirable to allow upgrading of an integrated circuit without disturbing the connection of the package to the circuit board.

SUMMARY OF THE INVENTION

There is a need for a flip chip package that is compatible with multiple die footprints, and a method of assembling a package that accommodates different dies, having different footprints.

These and other needs are met by embodiments of the present invention which provide a flip chip package compatible with first and second die footprints. The flip chip package of the invention comprises an interconnection substrate having a connection surface configured to receive an integrated circuit die that has either a first or second die footprint. Each die footprint comprises a plurality of conductive pads on the surface of the integrated circuit die. A plurality of conductive pads of the first die footprint have a different pattern than the plurality of conductive pads of the second die footprint. The interconnection substrate has a plurality of conductive pads on its connection surface. These conductive pads establish a connection to the conductive pads of an integrated circuit die. The connection surface conductive pads have a first section corresponding to the conductive pads of an integrated circuit with a first die footprint. The connections surface conductive pads also have a second section corresponding to the conductive pads of an integrated circuit with a second die footprint. The first and second sections of the connection surface conductive pads overlap so that at least one of the connection surface conductive pads in the first section is also one of the connection surface conductive pads in the second section.

The provision of a package with conductive pads arranged with overlapping first and second sections configured to correspond to the different footprints of first and second dies allows the same package to be used with different dies. At the same time, the package size does not need to be increased beyond the size of the larger die footprint since the two sections of conductive pads overlap one another.

The earlier stated needs are also met by another embodiment of the present invention which provides a method of assembling a flip chip package with either a first integrated circuit die having a plurality of conductive pads arranged in a first die footprint or a second integrated circuit die having a plurality of conductive pads arranged in a second die footprint different from the first die footprint. The method comprises the steps of selecting an integrated circuit die for flip chip connection to an interconnection substrate with a connection surface having a plurality of conductive pads. The integrated circuit die has either the first die footprint or the second die footprint. The selected integrated circuit die is positioned with respect to the interconnection substrate so that all of the conductive pads of the selected integrated circuit die contact a respective one of the connection surface conductive pads upon flipping the integrated circuit die onto the interconnection substrate. The integrated circuit die is then flipped onto the interconnection substrate.

One of the advantages of the present invention is that it allows different integrated circuit dies to be selected for flip chip connection to the interconnection substrate of the flip chip package. The selection of the integrated circuit die may be made regardless of whether it has a first die footprint or a second die footprint.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 4 is an enlarged perspective view of an electronic component comprising an integrated circuit chip containing pads and solder bumps arranged in a second die footprint to be electrically joined to the pad containing interconnection substrate of the present invention.

DESCRIPTION OF THE PREFERRED EMBODIMENTS

The present invention addresses and solves problems with respect to the reusability of flip chip packages to integrated circuit dies having different die footprints. It also lessens the number of package designs required for new die footprints. Hence, when a new die designed with a different die footprint is created, the package footprint does not necessarily have to be changed. This is achieved, in part, by providing a package with an interconnection substrate containing the conductive pads arranged with two sections. One of the sections has its conductive pads arranged to be a mirror image of the footprint of a first type of die. The other section has its conductive pads arranged as a mirror image of a second type of die having a different footprint from the first type of die. By overlapping the first and second sections, the size of the package footprint does not need to be any greater than the size of the larger of the footprints which the package will accommodate.

Figure 1:
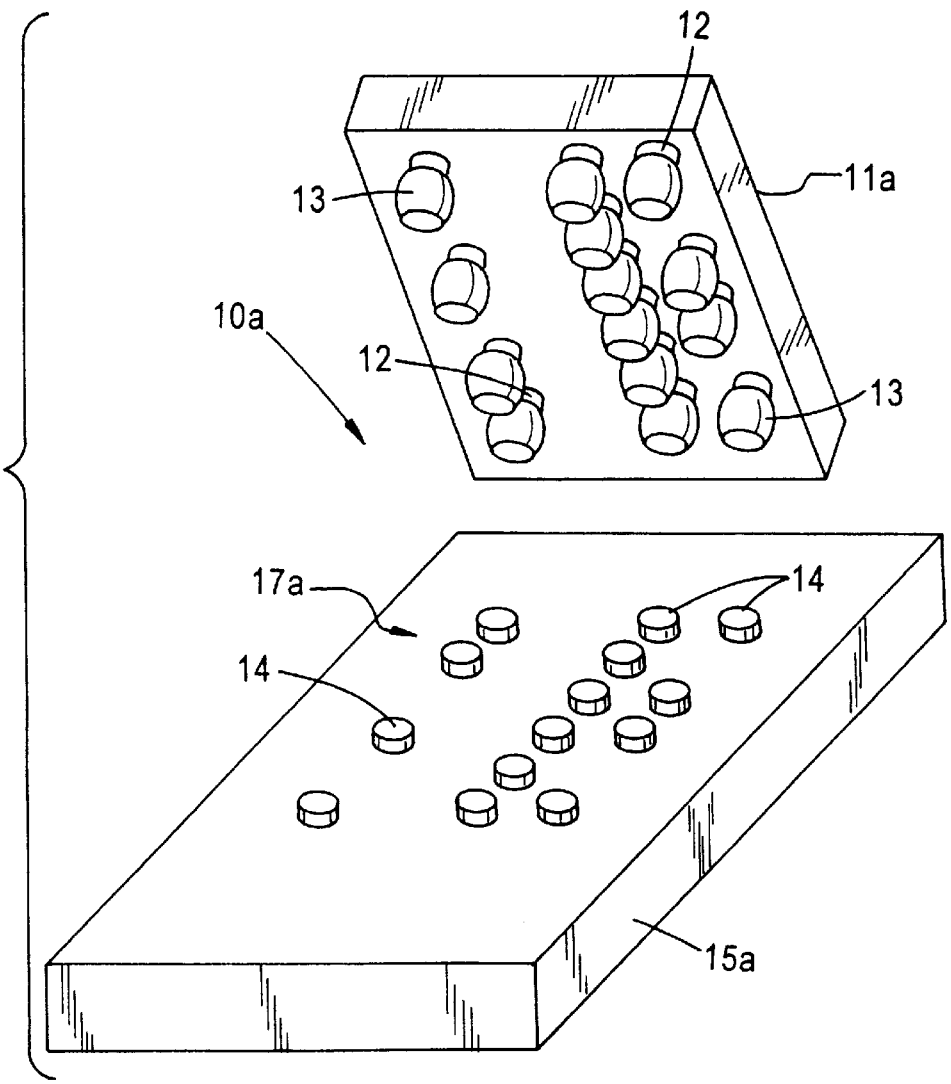
FIG. 1 is an enlarged perspective view of an electronic component comprising an integrated circuit chip containing pads and solder bumps arranged in a first die footprint to be electrically joined to a pad containing interconnection substrate with a packaged footprint corresponding to a first die footprint in accordance with the prior art.
Figure 2:
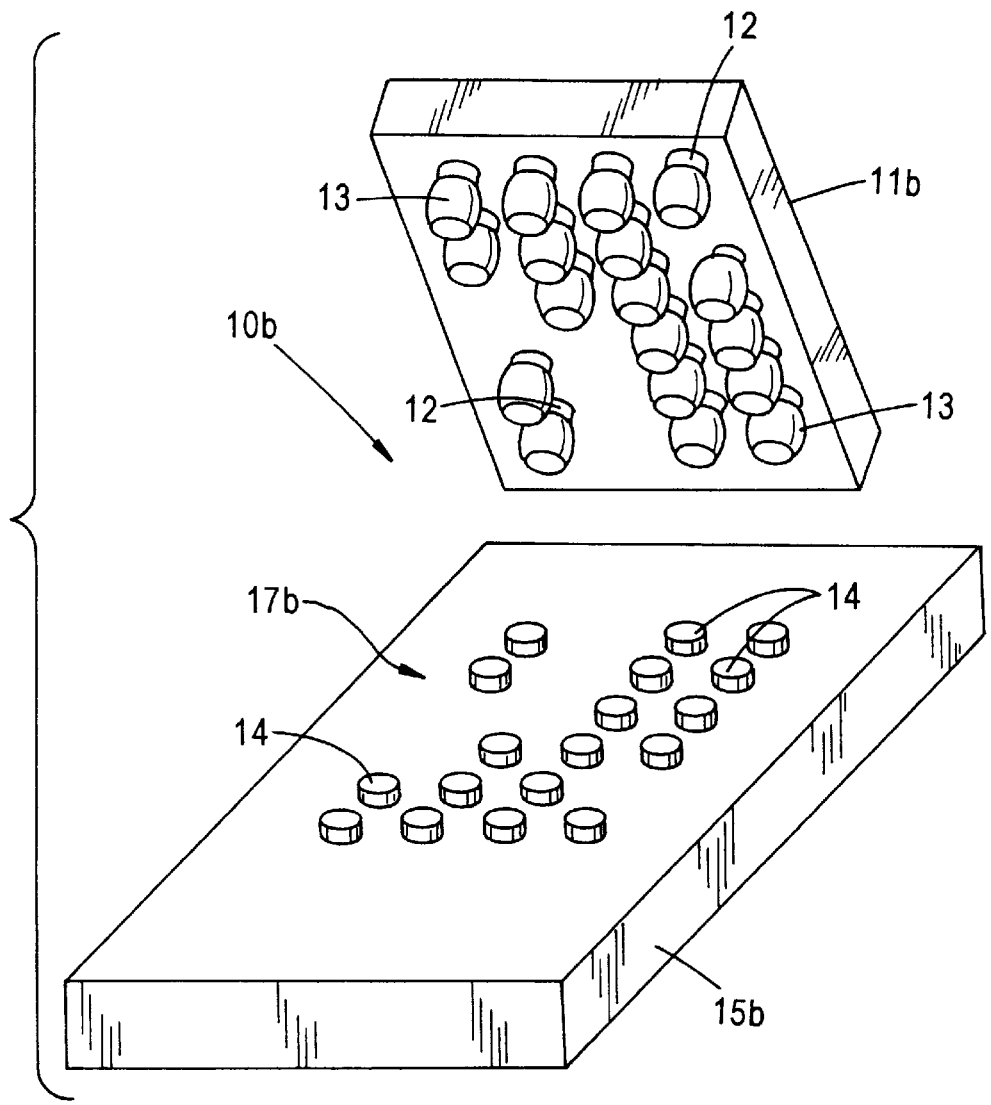
FIG. 2 is an enlarged perspective view of an electronic view of an electronic component comprising an integrated circuit chip containing pads and solder bumps arranged in a second die footprint to be electrically joined to a second pad containing interconnection substrate in accordance with the prior art.

FIGS. 1 and 2 are depictions of two different integrated circuit packages constructed in accordance with the prior art. Referring to FIG. 1, a typical electronic component 10a is shown comprising integrated circuit chip 11a and interconnection substrate 15a. Integrated circuit chip 11a is shown having conductive pads 12 overlaid with solder bumps 13. The conductive pads 12 are arranged on the integrated circuit chip 11a in a first pattern, or first die footprint.

Corresponding conductive pads 14 are shown on substrate 15a. The interconnection substrate 15a is thus uniquely designed to cooperate with the integrated circuit die 11a since the footprint 17a of the conductive pads 14 on the interconnection substrate 15a are a mirror image of the footprint of the integrated circuit die 11a.

FIG. 2 shows a view according to FIG. 1 but of a second integrated circuit die and interconnection substrate arrangement. The integrated circuit die 11b has its conductive pads 12 arranged in a different arrangement (i.e., die footprint) than the integrated circuit die 11a of FIG. 1. Likewise, the interconnection substrate 15b has its conductive pads 14 arranged with a different footprint 17b than the footprint 17a of the interconnection substrate 15a of FIG. 1.

It should be apparent that the interconnection substrate 15b, with its package footprint 17b, cannot be used to connect to the integrated circuit die 11a of the FIG. 1. Conversely, the interconnection substrate 15a of FIG. 1 cannot be used to connect to the integrated circuit die 11b of FIG. 2. Each interconnection substrate 15a, 15b has a unique package footprint particularly designed for use with a single design of the integrated circuit die 11a, 11b having a particular die footprint. Thus, it is desired to reuse interconnection substrate 15b of FIG. 2 with the integrated circuit die 11a of FIG. 1, this cannot be done because of the mismatch of the footprints.

Figure 3:
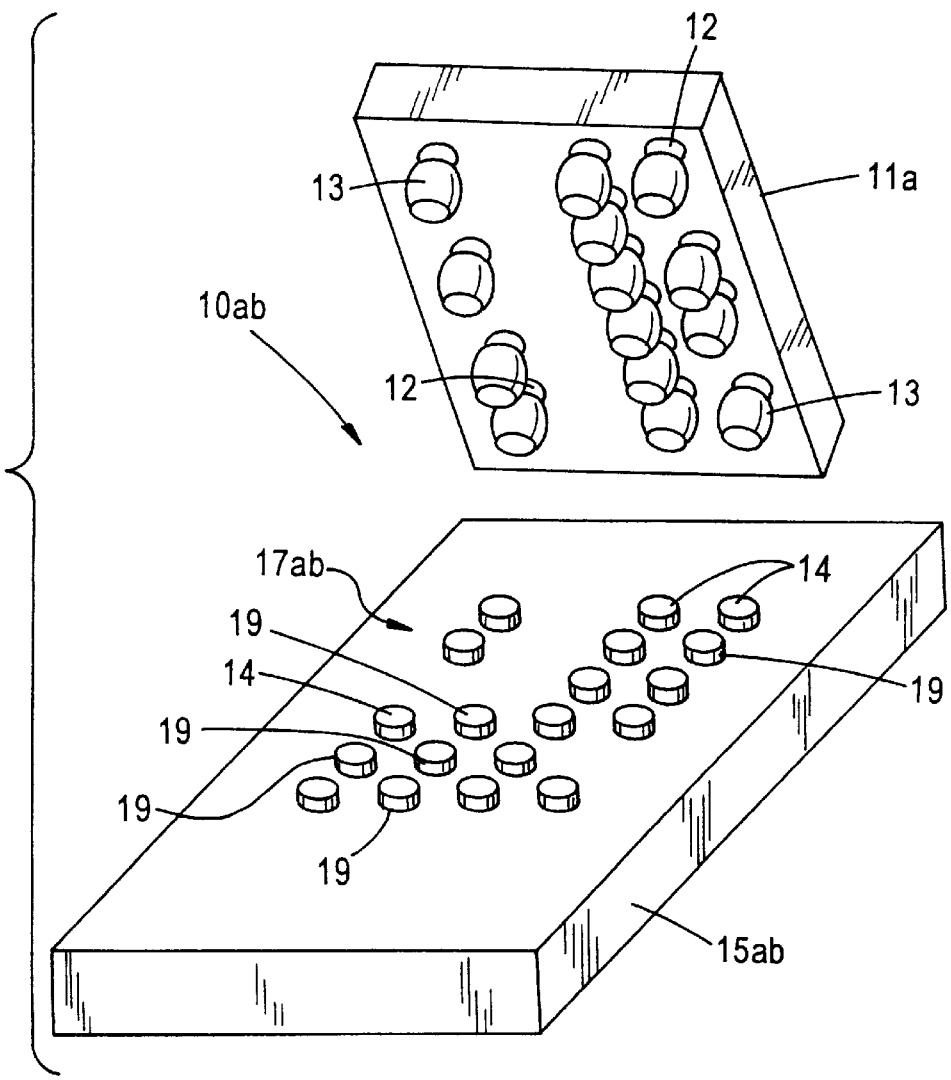
FIG. 3 is an enlarged perspective view of an electronic component comprising an integrated circuit chip containing pads and solder bumps arranged in a first die footprint to be electrically joined to a pad containing interconnection substrate in accordance with embodiments of the present invention.

The present invention, as depicted in FIGS. 3 and 4, provides a single interconnection substrate 15a, 15b that is able to accommodate at least two different types of integrated circuit dies 11a, 11b.

As depicted in FIG. 3, the interconnection substrate 15ab has a plurality of conductive pads 14 on its connection surface. These conductive pads 14 are arranged in a footprint 17ab as shown. The package footprint 17ab includes conductive pads 14 that mirror each of the conductive pads 12 in the first die footprint of the integrated circuit die 11a. It also includes additional conductive pads 19 that do not correspond to any of the conductive pads 12 of the integrated circuit die 11a. Hence, the package footprint 17ab may considered to contain a first section of conductive pads 14, this first section including all of those conductive pads that correspond to the conductive pads 12 of the integrated circuit 11a. Those conductive pads 19 that do not correspond to the conductive pads 12 of the integrated circuit 11a are not considered part of the first section of the package 17ab.

Since the package footprint 17ab of the interconnection substrate 15ab of the present invention contains conductive pads that correspond to each of the conductive pads 12 of the integrated circuit die 11a, the interconnection substrate 15ab is perfectly suitable for use as an interconnection substrate for the integrated circuit die 11a. The presence of the unused conductive pads on the interconnection substrate 15ab has no effect on the operation of the assembled integrated circuit package 10ab.

FIG. 4 depicts an integrated circuit package similar to FIG. 3, using the same interconnection substrate 15ab, but the second integrated circuit 11b having the second die footprint. The integrated circuit die 11b is the same as that depicted in prior art FIG. 2.

The interconnection substrate 15ab is that same as that used in the embodiment of FIG. 3. The package footprint 17b has a second section of conductive pads 14 that mirror the conductive pads 12 of the second integrated circuit die 11b. Hence, when the second integrated circuit 11b is flipped onto the interconnection substrate 15ab, there is a conductive pad 14 on the connection surface of the interconnection substrate 15ab for each of the conductive pads 12 on the second integrated circuit die 11b. Each of the conductive pads 14 that correspond to the conductive pads 12 of the second integrated circuit 11b are considered to be part of the second section of the package footprint 17ab. In this exemplary embodiment, only one of the conductive pads 19 is not part of the second section.

It should be apparent that the first and second sections have many overlapping conductive pads 14 in these exemplary embodiments. It should also be apparent to those of ordinary skill in the art that the patterns depicted in FIGS. 3 and 4 of the integrated circuit dies 11a, 11b and the package footprint 17ab is exemplary, and varied and other package footprints and integrated circuit die footprints are contemplated within the spirit and the scope of the present invention. Furthermore, it should be apparent that the package footprint 17ab may be configured to accommodate additional types of integrated circuit dies having different die footprints so that there will be more than two sections within the package footprint.

Some of the advantages of the present invention may be ascertained from the embodiments depicted in FIGS. 3 and 4. One of these advantages is that the package footprint may remain the same size as the larger of the die footprints of the multiple integrate circuit dies that are connectable to the interconnection substrate 15ab. This reduces the overall package size and is achieved by the overlapping of the conductive pads 14 in the different sections of the package footprint. Another advantage provided by the present invention is the reusability of the same interconnection substrate 15ab in the event that it is desired to exchange one of the interconnection substrates (e.g., 11a) for another interconnection substrate (e.g., 11b) already connected to the interconnection substrate 15ab. A further advantage provided by the present invention is that the same package 15ab, having a single package footprint design, may be used with different integrated circuit designs without having to redesign the package footprint.

Although the present invention has been described and illustrated in detail, it is to be clearly understood that the same as by way of illustration and example only and is not to be taken by way of limitation, the scope of the present invention being limited only by the terms of the appended claims.

What is claimed is:

1. A flip chip package compatible with first and second die footprints, comprising:

an interconnection substrate having a connection surface configured to receive one of at least a first integrated circuit die having a first die footprint and a second integrated circuit die having a second, different die footprint, the first die footprint of the first integrated circuit die comprising a plurality of conductive pads arranged on a surface of the first integrated circuit die in a first pattern, and the second die footprint of the second integrated circuit die comprising a plurality of conductive pads arranged on a surface of the second integrated circuit die in a second pattern, different from the first pattern; and a plurality of conductive pads on the connection surface of the interconnection substrate configured to establish a connection to the plurality of conductive pads of the first integrated circuit die and the plurality of conductive pads of the second integrated circuit die, the connection surface conductive pads having at least a first section of conductive pads corresponding to the plurality of conductive pads of the first integrated circuit with the first die footprint, and a second section of conductive pads corresponding to the plurality of conductive pads of the second integrated circuit with the second die footprint, wherein the first section of conductive pads all connect to the plurality of conductive pads of the first integrated circuit die when the first integrated circuit die is connected to the connection surface of the interconnection substrate and the second section of conductive pads all connect to the plurality of conductive pads of the second integrted circuit die when the second integrated circuit die is connected to the connection surface of the interconnection substrate, and at least one conductive pad of the first section of conductive pads is part of the second section of conductive pads.

* * * * *